United States Patent
Shih

(10) Patent No.: US 6,292,030 B1
(45) Date of Patent: Sep. 18, 2001

(54) PRE-CHARGED HIGH-SPEED COMPARATOR

(75) Inventor: Her-Y Shih, Taichung (TW)

(73) Assignee: Topic Semiconductor Corp., Hsinchu (TW)

( * ) Notice: Subject to any disclaimer, the term of this patent is extended or adjusted under 35 U.S.C. 154(b) by 0 days.

(21) Appl. No.: 09/695,436

(22) Filed: Oct. 23, 2000

(30) Foreign Application Priority Data

Sep. 18, 2000 (TW) .................................................. 89119112

(51) Int. Cl.$^7$ .............................. G01R 19/00; G11C 7/00; H03F 3/45
(52) U.S. Cl. .................................. 327/55; 327/57; 327/64; 365/205; 365/207
(58) Field of Search .................................. 327/50–55, 57, 327/56, 63, 64, 65, 215, 219, 225, 562, 563; 365/205, 207

(56) References Cited

U.S. PATENT DOCUMENTS

| | | | |
|---|---|---|---|
| 4,169,233 | * | 9/1979 | Haraszti .................................. 327/57 |
| 4,608,670 | * | 8/1986 | Duvvury et al. ...................... 365/205 |
| 4,843,264 | * | 6/1989 | Galbraith .............................. 327/55 |
| 5,491,667 | * | 2/1996 | Sharp .................................... 365/205 |
| 5,508,644 | * | 4/1996 | Branson et al. ...................... 327/57 |
| 5,544,110 | * | 8/1996 | Yuh ........................................ 327/57 |
| 5,604,705 | * | 2/1997 | Ackland et al. ...................... 365/205 |
| 5,650,971 | * | 7/1997 | Longway et al. ..................... 365/207 |
| 6,157,587 | * | 12/2000 | Reddy et al. ......................... 365/207 |

* cited by examiner

*Primary Examiner*—Terry D. Cunningham
*Assistant Examiner*—Long Nguyen
(74) *Attorney, Agent, or Firm*—Jiawei Huang; J.C. Patents

(57) ABSTRACT

A pre-charged high-speed comparator includes a first negative phase logic switch, a second negative phase logic switch, a third negative phase logic switch, a first positive phase logic switch, a fourth negative phase logic switch, a second positive phase logic switch, a third positive phase logic switch, a fourth positive phase logic switch and a fifth positive phase logic switch. The two output terminals of the pre-charged high-speed comparator is raised to a voltage roughly half of a source voltage so that the time required for a regeneration circuit that includes the third negative phase logic switch, the first positive phase logic switch, the fourth negative phase logic switch and the second positive phase logic switch to get into the transistor active region is shortened, thereby increasing the overall operating speed of the comparator circuit.

7 Claims, 5 Drawing Sheets

PRE-CHARGED HIGH-SPEED COMPARATOR

CROSS-REFERENCE TO RELATED APPLICATION

This application claims the priority benefit of Taiwan application serial no. 89119112, filed Sep. 18, 2000.

BACKGROUND OF THE INVENTION

1. Field of Invention

The present invention relates to a comparator. More particularly, the present invention relates to a comparator capable of receiving different analogue input signals and rapidly producing an output signal that distinguishes between high and low potential.

2. Description of Related Art

For the various types of analogue/digital (A/D) converters (for example, flash ADC, Interpolation ADC, Pipeline ADC and Two-step ADC), high-speed comparator is an essential internal component.

FIG. 1 is the circuit diagram of a conventional comparator. As shown in FIG. 1, the devices including PMOS latchp1 14, PMOS latchp2 12, NMOS latchn1 20 and NMOS latchn2 28 together form the regeneration stage of a comparator 28. The devices including PMOS resetp1 16 and PMOS resetp2 10 together form the reset circuit of the comparator 28. The devices including NMOS minm 22 and NMOS minp 24 together form a group of analogue amplifying circuit in the comparator 28. The device NMOS strb 26 serves as a current switch for the comparator 28.

In FIG. 1, when a latch signal with a low potential is applied to the input latch terminal of the comparator 28, the device NMOS strb 26 is in an open-circuit state while the devices NMOS resetp1 16 and PMOS resetp2 10 are in a conductive state. Hence, the output terminal outp and the output terminal outn are reset to a voltage vdda. When a latch signal with a high potential is applied to the input latch terminal of the comparator 28, the device NMOS strb 26 is in a conductive state while the devices NMOS resetp1 16 and PMOS resetp2 10 are in an open-circuit state. The group of devices including PMOS latchp1 14, PMOS latchp2 12, NMOS latchn1 20 and NMOS latchn2 18 are triggered to initiate regeneration. The input analogue signal sent to the input terminal inm of the device NMOS minp 24 is compared with the input analogue signal sent to the input terminal inp of the device NMOS minm 22 until the terminal, among the output terminal outp and the output terminal outm, with a higher potential are found.

FIG. 2 is a graph showing the results of simulating the operation of a conventional comparator. As shown in FIG. 2, the voltages at the output terminal outp and the output terminal outm must drop from vdda to about ½ vdda before PMOS latchp1 14, PMOS latchp2 12, NMOS latchn1 20 and NMOS latchn2 18 of the regeneration circuit are within the active region and able to find out which of the terminal among the output terminals outp and outm has a higher potential.

Since the voltages at the output terminals outp and outm must drop from vdda (the $3n$ axis position in FIG. 2) to about ½ vdda (the $3.2n$ axis position in FIG. 2) before PMOS latchp1 14, PMOS latchp2 12, NMOS latchn1 20 and NMOS latchn2 18 of the regeneration circuit are within the active region (transistors together have a positive gain), operating speed of the comparator is ultimately limited by the dropping period.

SUMMARY OF THE INVENTION

Accordingly, one object of the present invention is to provide a pre-charged high-speed comparator capable of speeding up the time required for bringing a regeneration circuit into an active region, thereby increasing the overall operating speed of the comparator.

To achieve these and other advantages and in accordance with the purpose of the invention, as embodied and broadly described herein, the invention provides a pre-charged high-speed comparator. The comparator includes a first negative phase logic switch, a second negative phase logic switch, a third negative phase logic switch, a pre-charged high-speed comparator, a first positive phase logic switch, a fourth negative phase logic switch, a second positive phase logic switch, a third positive phase logic switch, a fourth positive phase logic switch and a fifth positive phase logic switch.

A first terminal of the first negative phase logic switch is connected to a power source terminal. The signal terminal of the first negative phase logic switch receives a biased voltage signal. A first terminal of the second negative phase logic switch is connected to a power source terminal. A second terminal of the second negative phase logic switch is connected to a second terminal of the first negative phase logic switch. The signal terminal of the second negative phase logic switch receives a latch signal.

A first terminal of the third negative phase logic switch is connected to the second terminal of the first negative phase logic switch. A second terminal of the third negative phase logic switch is connected to a first output terminal of the pre-charged high-speed comparator. A signal terminal of the third negative phase logic switch is connected to a second output terminal of the pre-charged high-speed comparator. A first terminal of the first positive phase logic switch is connected to the second terminal of the third negative phase logic switch. A signal terminal of the first positive phase logic switch is connected to a signal terminal of the third negative phase logic switch. A first terminal of the fourth negative phase logic switch is connected to the second terminal of the second negative phase logic switch. A second terminal of the fourth negative phase logic switch is connected to the second output terminal of the pre-charged high-speed comparator. A signal terminal of the fourth negative phase logic switch is connected to the first output terminal of the pre-charged high-speed comparator. A first terminal of the second positive phase logic switch is connected to the second terminal of the fourth negative phase logic switch. A signal terminal of the second positive phase logic switch is connected to the signal terminal of the fourth negative phase logic switch.

A first terminal of the third positive phase logic switch is connected to the signal terminal of the third negative phase logic switch. A second terminal of the third positive phase logic switch is connected to the signal terminal of the fourth negative phase logic switch. A signal terminal of the third positive phase logic switch receives a reset signal. A first terminal of the fourth positive phase logic switch is connected to the second terminal of the first positive phase logic switch. A second terminal of the fourth positive phase logic switch is connected to ground. A signal terminal of the fourth positive phase logic switch receives a first analogue signal. A first terminal of the fifth positive phase logic switch is connected to the second terminal of the second positive phase logic switch. A second terminal of the fifth positive phase logic switch is connected to ground. A signal terminal of the fifth positive phase logic switch receives a second analogue signal.

When the latch signal and the reset signal are both high, no current passes into the pre-charged high-speed comparator and the third positive phase logic switch shorts the first output terminal and the second output terminal of the pre-charged high-speed comparator so that the first output terminal and the second output terminal of the pre-charged high-speed comparator approach a ground voltage. A little while before the latch signal changes from a high potential to a low potential, the biased voltage signal changes from a high potential to a low potential. Hence, current flows in from the first negative phase logic switch and the first output terminal and the second output terminal of the pre-charged high-speed comparator is raised to a voltage of about half of the power source voltage. Thus, the third negative phase logic switch, the fourth negative phase logic switch, the first positive phase logic switch and the second positive phase logic switch are lead into a preparatory working state. Subsequently, when the latch signal changes from a high potential to a low potential, the signal resulting from a comparison between the signal issued from the signal terminal of the fourth positive phase logic switch and the signal issued from the signal terminal of the fifth positive phase logic switch is rapidly amplified to a high potential or a low potential at the first output terminal and the second output terminal of the pre-charged high-speed comparator through the third negative phase logic switch, the fourth negative phase logic switch, the first positive phase logic switch and the second positive phase logic circuit.

In brief, this invention provides a pre-charged high-speed comparator capable of raising the voltage at its two output terminals to a level roughly half of the source voltage. Consequently, the time required for triggering the transistors of a regeneration circuit into their active region is greatly reduced, thereby increasing the overall operating speed of the comparator circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
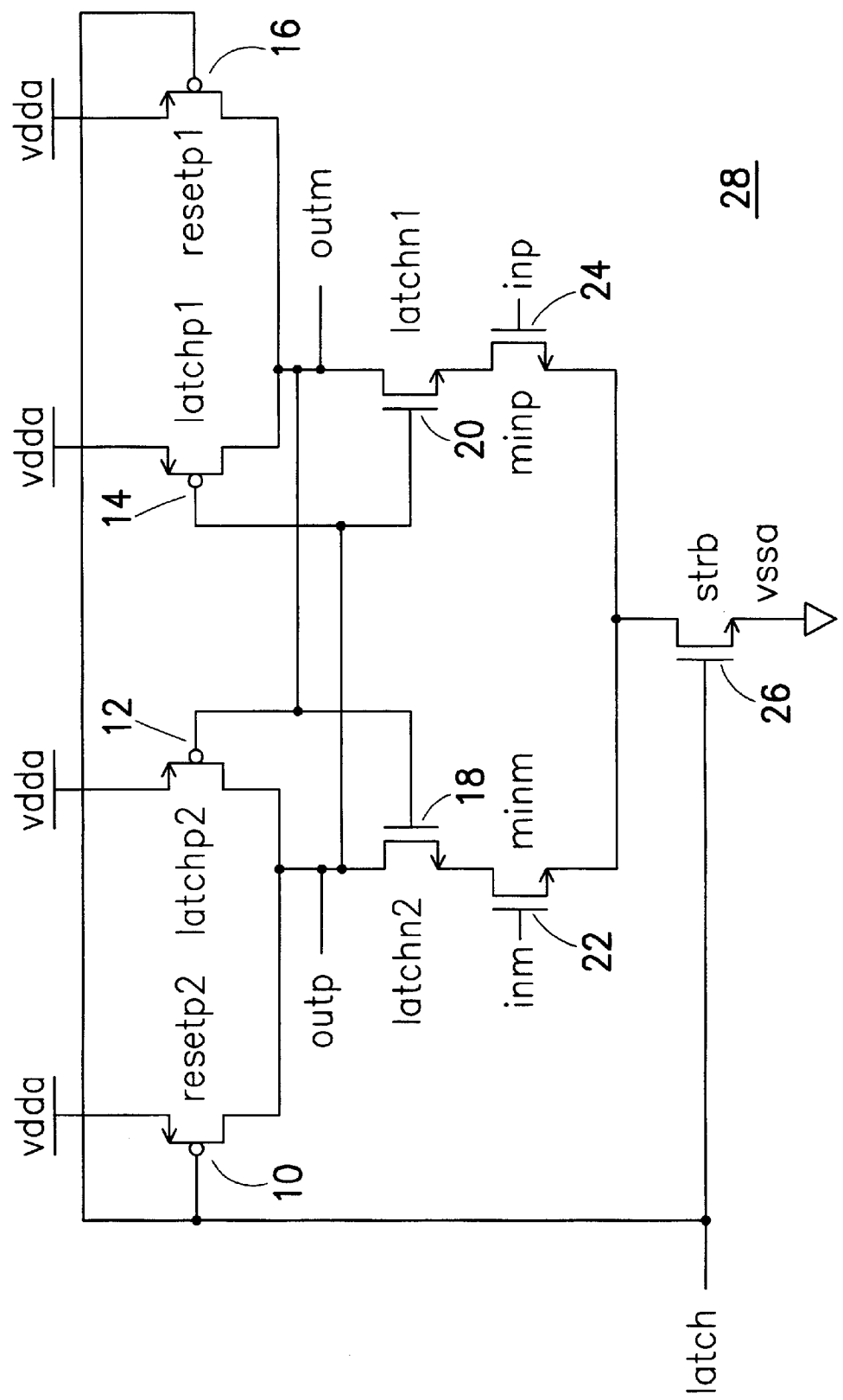
FIG. 1 is the circuit diagram of a conventional comparator.
Figure 2:
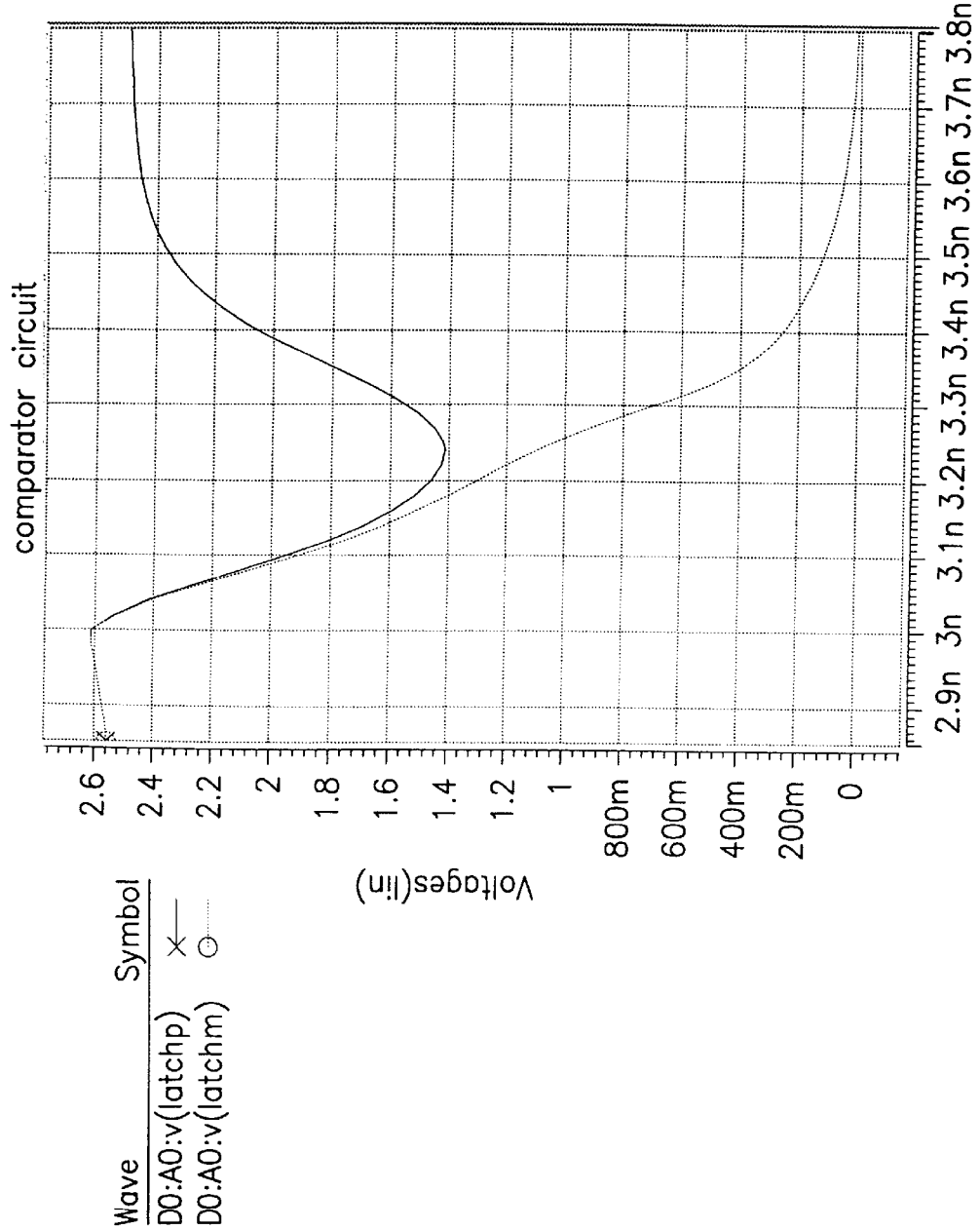
FIG. 2 is a graph showing the results of simulating the operation of a conventional comparator.

Reference will now be made in detail to the present preferred embodiments of the invention, examples of which are illustrated in the accompanying drawings. Wherever possible, the same reference numbers are used in the drawings and the description to refer to the same or like parts.

Figure 3:
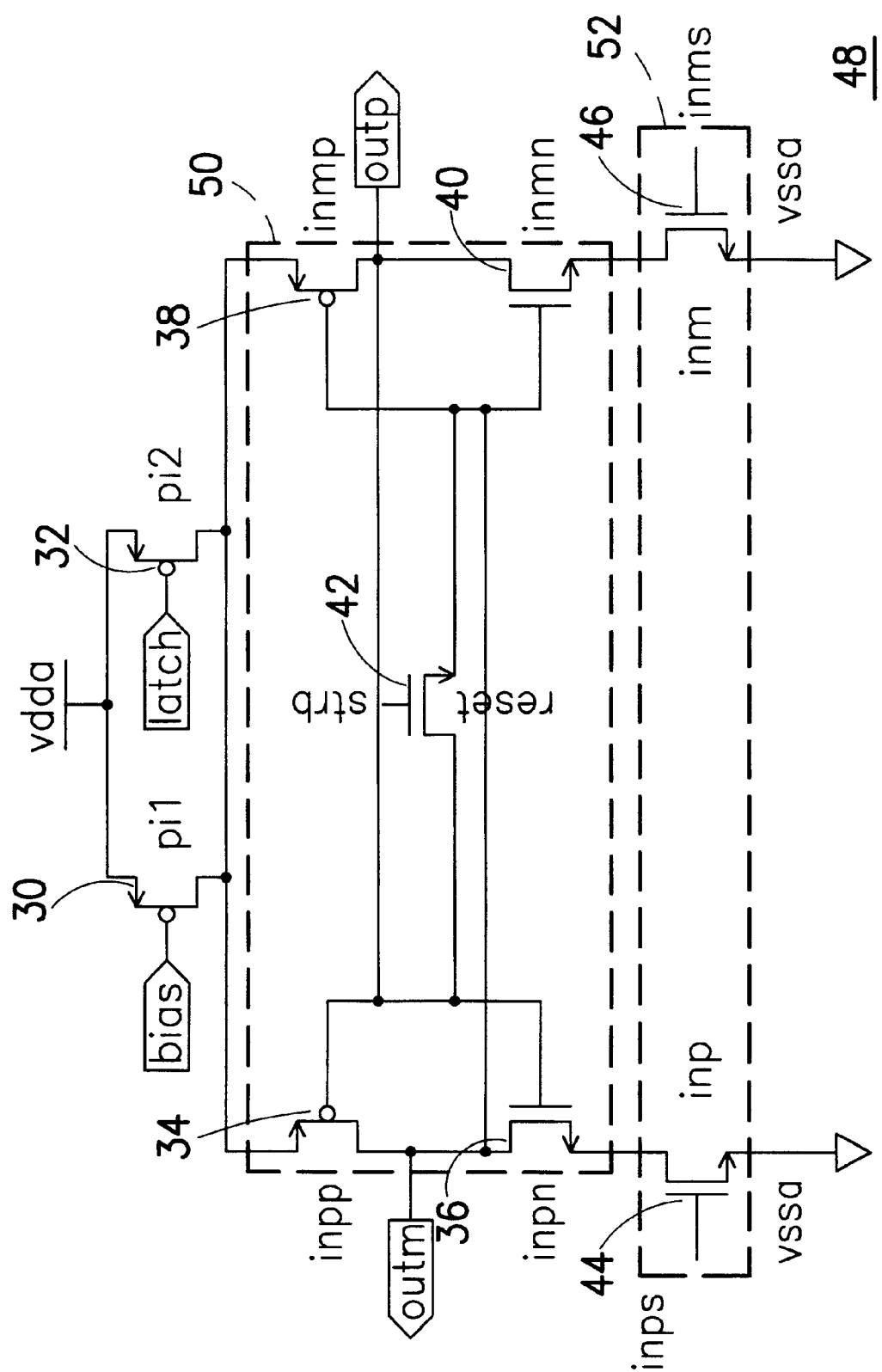
FIG. 3 is a circuit diagram of a pre-charged high-speed comparator according to the invention.

FIG. 3 is a circuit diagram of a pre-charged high-speed comparator according to the invention. As shown in FIG. 3, a source terminal of a PMOS pi1 30 is connected to a voltage source vdda and the gate terminal of the PMOS pi1 30 is connected to a terminal for receiving a biased voltage signal. A source terminal of a PMOS pi2 32 is connected to the source voltage vdda, a drain terminal of the PMOS pi2 32 is connected to a drain terminal of the PMOS pi1 30 and a gate terminal of the PMOS pi2 32 is connected to a terminal for receiving a latch signal. A source terminal of a PMOS inpp 34 is connected to the drain terminal of the PMOS pi1 30, a drain terminal of the PMOS inpp 34 is connected to an output terminal outm of a pre-charged high-speed comparator 48 and the gate terminal of the PMOS inpp 34 is connected to another output terminal outp of the pre-charged high-speed comparator 48. A drain terminal of an NMOS inpn 36 is connected to the drain terminal of the PMOS inpp 34 and a gate terminal of the NMOS inpn 36 is connected to the gate terminal of the PMOS inpp 34. A source terminal of a PMOS inmp 38 is connected to the drain terminal of the PMOS pi2 32, a drain terminal of the PMOS inmp 38 is connected to the gate terminal of the PMOS inpp 34 and the output terminal outp of the pre-charged high-speed comparator 48 and a gate terminal of the PMOS inmp 38 is connected to the output terminal outm of the pre-charged high-speed comparator. A drain terminal of an NMOS inmn 40 is connected to the drain terminal of the PMOS inmp 38 and a gate terminal of the NMOS inmn 40 is connected to the gate terminal of the PMOS inmp 38.

A drain terminal of an NMOS reset 42 is connected to the gate terminal of the PMOS inpp 34, a source terminal of the NMOS reset 42 is connected to the gate terminal of the PMOS inmp 38 and a gate terminal of the NMOS reset 42 is connected to a terminal for receiving a reset signal. A drain terminal of an NMOS inp 44 is connected to the source terminal of the NMOS inpn 36, a source terminal of the NMOS inp 44 is connected to ground and a gate terminal of the NMOS inp 44 is connected to a terminal for receiving an analogue signal inps. A drain terminal of an NMOS inm 46 is connected to the source terminal of the NMOS inmn 40, a source terminal of the NMOS inm 46 is connected to ground and a gate terminal of the NMOS inm 36 is connected to a terminal for receiving another analogue signal inms.

The devices including PMOS inpp 34, PMOS inmp 38, NMOS inpn 36, NMOS inmn 40 form a regeneration circuit 50. The device PMOS pi1 30 serves as a pre-amplifier circuit. The device NMOS reset 42 serves as a switch for resetting the output signal at the output terminals outp and outm of the pre-charged high-speed comparator 48. The devices including NMOS inp 44 and NMOS inm 46 form a comparator circuit 52.

Figure 4:
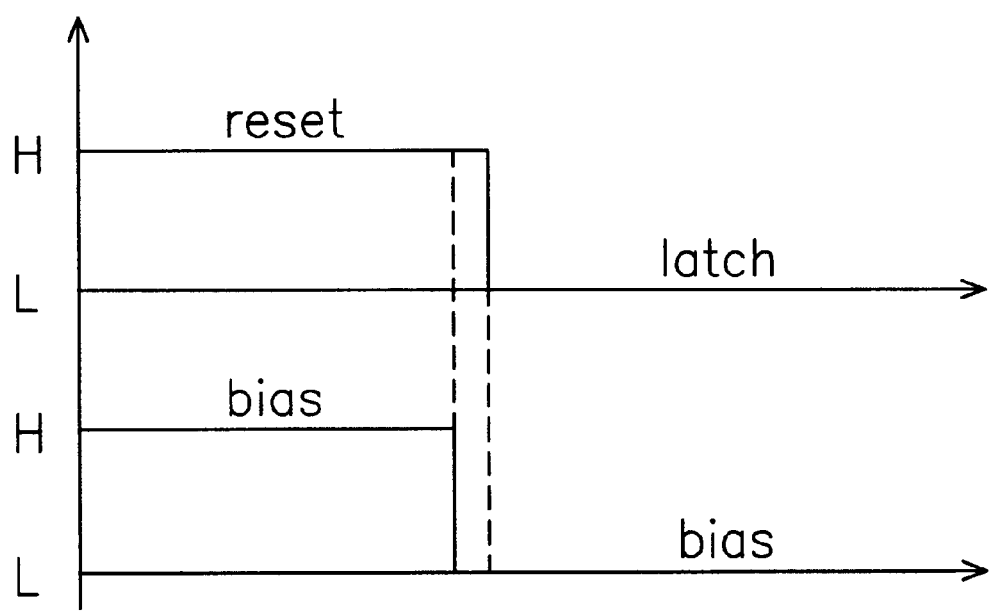
FIG. 4 is a graph showing the input signal waveform of the pre-charged high-speed comparator according to the invention.

FIG. 4 is a graph showing the input signal waveform of the pre-charged high-speed comparator according to the invention. As shown in FIG. 4, when the latch signal (the reset signal) is 'H' (a high potential) and the bias signal is 'H', no current passes through the pre-charged high-speed comparator 48 and the NMOS reset 42 shorts the output terminals outp and outp of the pre-charged high-speed comparator 48 together so that both the output terminals outm and outp approach an earth voltage vssa.

A little while before the latch signal changes from 'H' to 'L' (a low potential), the bias signal changes from 'H' to 'L'. Current flows into PMOS pi1 30 and the output terminals outm and outp of the pre-charged high-speed comparator 48 rise to about half of the voltage source vdda. Hence, the devices including PMOS inpp 34, PMOS inmp 38, NMOS inpn 36, NMOS inmn 40 now operate in transistor active region.

Later, when the latch signal changes from 'H' to 'L', the group of devices including PMOS inpp 34, PMOS inmp 38, NMOS inpn 36, NMOS inmn 40 is capable of amplifying the signal at the output terminals outm and outp of the pre-charged high-speed comparator 48 to a high 'H' or low 'L' potential level after the analogue signal inps applied to the gate terminal of the device NMOS inp 44 and the analogue signal inms applied to the gate terminal of the device NMOS inm 46 are compared.

Figure 5:
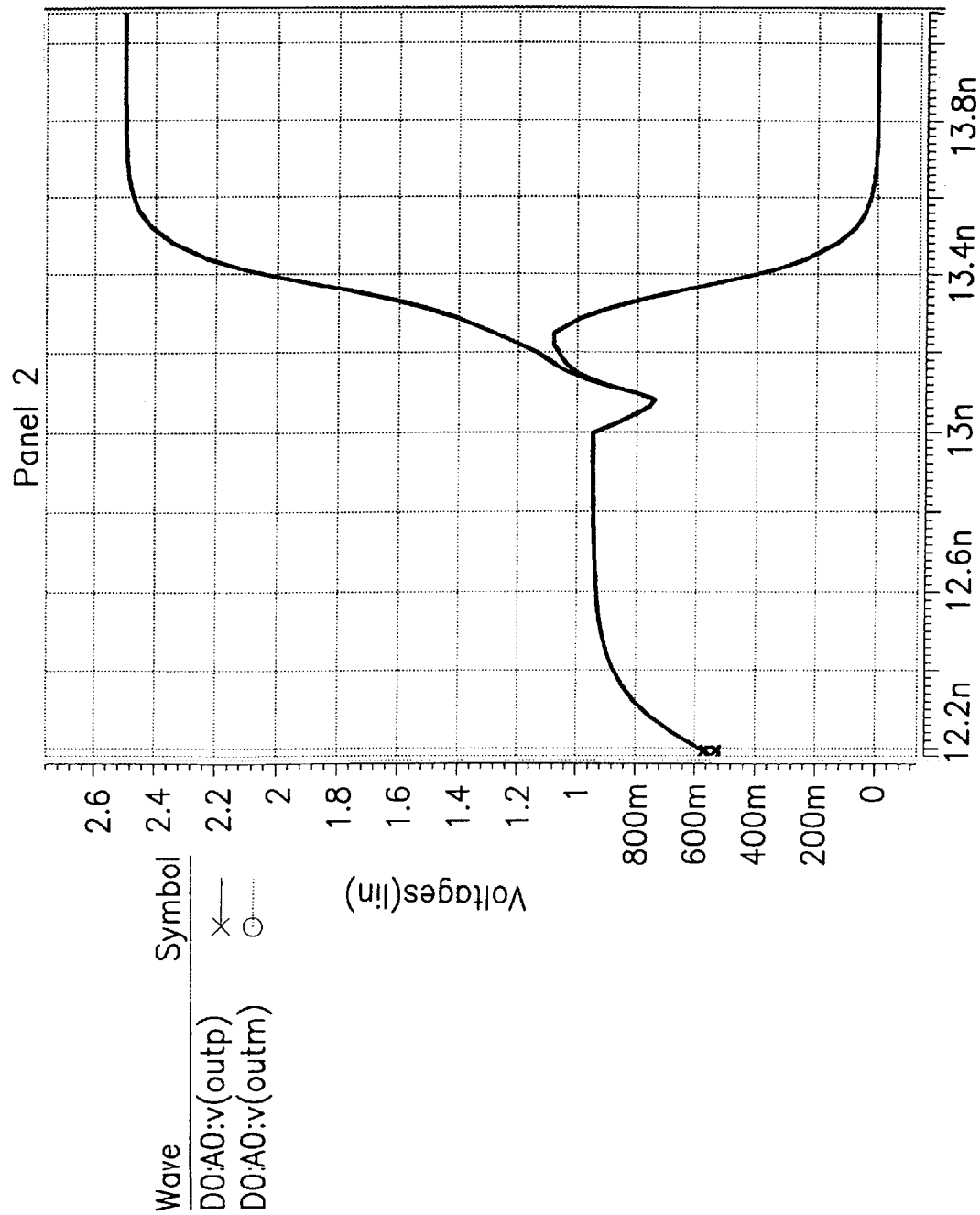
FIG. 5 is a graph showing the results of simulating the operation of the pre-charged high-speed comparator according to this invention.

FIG. 5 is a graph showing the results of simulating the operation of the pre-charged high-speed comparator according to this invention. In this invention, process steps very similar to the one used in the fabrication of a conventional comparator are used. Moreover, dimensions and operating characteristics of the transistors in the comparator circuit are also very similar. As shown in FIG. 5, before the regeneration circuit starts to amplify the signal, voltage at the two output terminals of the pre-charged high-speed comparator has already risen to about half of the voltage provided by the voltage source. Hence, when a comparison of the analogue signals (axis position 13n shown in FIG. 5) is initiated in the pre-charged high-speed comparator, the resulting signals, can be rapidly amplified to a high or a low voltage level at the two output terminals of the pre-charged high-speed comparator.

In conclusion, this invention provides a pre-charged high-speed comparator capable of raising the voltage at its two output terminals to a level roughly half of the source voltage. Ultimately, the time required for triggering the transistors of a regeneration circuit into their active region is greatly reduced, thereby increasing the overall operating speed of the comparator circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pre-charged high-speed comparator, comprising:

a first negative phase logic switch, wherein a first terminal is connected to a voltage source and a signal terminal is connected to a terminal for receiving a biased voltage signal;

a second negative phase logic switch, wherein a first terminal is connected to the voltage source, a second terminal is connected to a second terminal of the first negative phase logic switch and a signal terminal is connected to a terminal for receiving a latch signal;

a third negative phase logic switch, wherein a first terminal is connected to the second terminal of the first negative phase logic switch, a second terminal is connected to a first output terminal of a pre-charged high-speed comparator, and a signal terminal is connected to a second output terminal of the pre-charged high-speed comparator;

a first positive phase logic switch, wherein a first terminal is connected to the second terminal of the third negative phase logic switch and a signal terminal is connected to the signal terminal of the third negative phase logic switch;

a fourth negative phase logic switch, wherein a first terminal is connected to the second terminal of the second negative phase logic switch, a second terminal connected to the second output terminal of the pre-charged high-speed comparator, and a signal terminal is connected to the first output terminal of the pre-charged high-speed comparator;

a second positive phase logic switch, wherein a first terminal is connected to the second terminal of the fourth negative phase logic switch, and a signal terminal is connected to the signal terminal of the fourth negative phase logic switch;

a third positive phase logic switch, wherein a first terminal is connected to the signal terminal of the third negative phase logic switch, a second terminal is connected to the signal terminal of the fourth negative phase logic switch, and a signal terminal is connected to a terminal for receiving a reset signal;

a fourth positive phase logic switch, wherein a first terminal is connected to the second terminal of the first positive phase logic switch, a second terminal is connected to a ground, and a signal terminal is connected to a terminal for receiving a first analogue signal; and a fifth positive phase logic switch, wherein a first terminal is connected to the second terminal of the second positive phase logic switch, a second terminal is connected to the ground and a signal terminal is connected to a terminal for receiving a second analogue signal;

wherein when the latch signal and the reset signal are both high, no current passes into the pre-charged high-speed comparator and the third positive phase logic switch shorts the first output terminal and the second output terminal of the pre-charged high-speed comparator so that the first output terminal and the second output terminal of the pre-charged high-speed comparator approach a ground voltage, and a little while before the latch signal changes from a high potential to a low potential, the biased voltage signal changes from a high potential to a low potential so that current flows in from the first negative phase logic switch and the first output terminal and the second output terminal of the pre-charged high-speed comparator is raised to a voltage of about half of the power source voltage, subsequently, the third negative phase logic switch, the fourth negative phase logic switch, the first positive phase logic switch and the second positive phase logic switch is lead into a preparatory working state, and subsequently, when the latch signal changes from a high potential to a low potential, the signal resulting from a comparison between the signal issued from the signal terminal of the fourth positive phase logic switch and the signal issued from the signal terminal of the fifth positive phase logic switch is rapidly amplified to a high potential or a low potential at the first output terminal and the second output terminal of the pre-charged high-speed comparator through the third negative phase logic switch, the fourth negative phase logic switch, the first positive phase logic switch and the second positive phase logic circuit.

2. The comparator of claim 1, wherein the first negative phase logic switch, the second negative phase logic switch, the third negative phase logic switch and the fourth negative phase logic switch are PMOS transistors.

3. The comparator of claim 1, wherein the first positive phase logic switch, the second positive phase logic switch, the third positive phase logic switch and the fourth positive phase logic switch are NMOS transistors.

4. The comparator of claim 1, wherein the third negative phase logic switch, the fourth negative phase logic switch, the first positive phase logic switch and the second positive phase logic switch together form a regeneration circuit.

5. The comparator of claim 1, wherein the first negative phase logic circuit serves as a pre-amplifier.

6. The comparator of claim 1, wherein the third positive phase logic switch serves as a control switch for resetting signal output from the first and the second output terminal.

7. The comparator of claim 1, wherein the fourth positive phase logic switch and the fifth positive phase logic switch together form a comparator circuit.

* * * * *